United States Patent
Boureau et al.

(10) Patent No.: US 6,683,684 B1
(45) Date of Patent: Jan. 27, 2004

(54) DEVICE FOR MEASURING RELATIVE POSITION ERROR

(75) Inventors: Damien Boureau, Rouen (FR); David Clavier, Rouen (FR)

(73) Assignee: Automa-Tech, Val de Reuil (FR)

( * ) Notice: Subject to any disclaimer, the term of this patent is extended or adjusted under 35 U.S.C. 154(b) by 310 days.

(21) Appl. No.: 09/688,900

(22) Filed: Oct. 16, 2000

(30) Foreign Application Priority Data

Nov. 3, 1999 (FR) ............................................. 99 13725

(51) Int. Cl.$^7$ ............................................. G01N 21/00
(52) U.S. Cl. ................................................. 356/237.6
(58) Field of Search ..................... 356/237.1–237.6, 356/399–401, 614–640

(56) References Cited

U.S. PATENT DOCUMENTS 5,264,869 A * 11/1993 Appel et al. ................. 347/248

FOREIGN PATENT DOCUMENTS

| DE | 241 562 | 12/1986 |
|---|---|---|
| EP | 0 618 505 | 10/1994 |

* cited by examiner

Primary Examiner—Tu T. Nguyen
(74) Attorney, Agent, or Firm—O'Melveny & Myers LLP

(57) ABSTRACT

The invention relates to a device for measuring relative position error between a laser beam and a target. The target is provided with a circular orifice occupying a reference position relative to said target. The device has means for focusing the laser beam in the plane of said target, means for taking an image of said circular hole and of the beam focused in the plane of said target, and means for calculating the components of the segment joining said point of impact and the center of said hole.

9 Claims, 2 Drawing Sheets

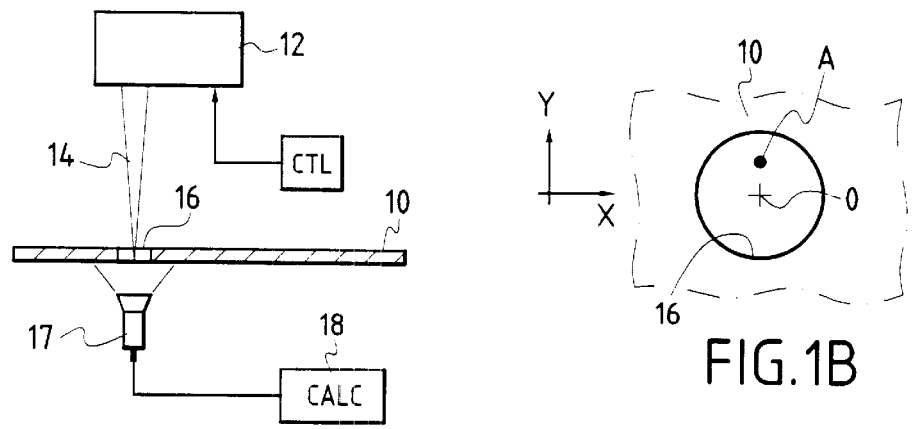
FIG.1A
FIG.1B
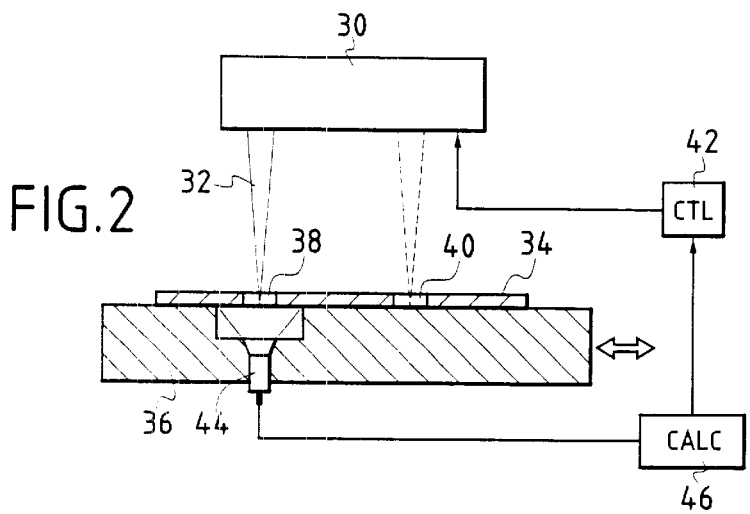
FIG.2
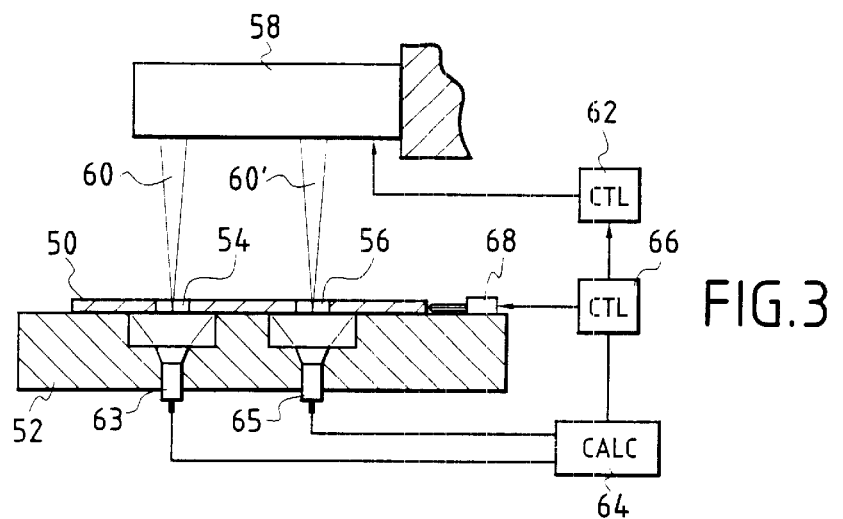
FIG.3

DEVICE FOR MEASURING RELATIVE POSITION ERROR

The invention relates to a device for measuring relative position error between a laser beam and a target, and also to applications of the device to making a machine for exposing printed circuit panels.

BACKGROUND OF THE INVENTION

In order to manufacture printed circuits by conventional methods, a known step consists in covering the conductive layer of the printed circuit panel in a layer of resist material and in exposing said resist layer through an artwork so as to enable the shape of the desired conductor tracks to be obtained on the printed circuit. After the layer of resist has been exposed, non-exposed zones are removed, which zones correspond to those portions of the conductive layer that are to be removed.

Another known technique which is becoming more widespread consists in making printed circuit panels in which the resist layer is imprinted locally by impact from a laser beam. The position of the laser beam impact on the panel is controlled as a general rule by a scanning assembly comprising a rotary polygonal mirror combined with a control laser beam interrupter device which is usually constituted by an acousto-optical modulator.

Other techniques that also use a laser beam consist either in ablating the layer of resist directly by means of a laser beam, or else in not using a layer of resist at all, and in ablating the conductive layer directly by means of a laser beam.

Since the number of laser beam impact points is naturally very large in order to achieve the precision required on a printed circuit panel of large size, it is advantageous to be able to subdivide the surface of the printed circuit panel into a plurality of zones and to scan each of the zones simultaneously by means of a respective laser beam.

In machines which enable that operation to be performed and which are referred to below as "exposure machines", two main relative positioning problems arise. Firstly, it is necessary to calibrate the position of the laser beam or of each laser beam accurately relative to the structure of the exposure machine, and secondly it is necessary to position the printed circuit panel that is to be exposed by the laser beam with very great accuracy on the structure of the machine.

For laser beam calibration, it will be understood that, in the machine, the beam is directed towards the printed circuit panel through an optical unit which includes a large number of optical components. In addition, the printed circuit panel is scanned as a general rule with the help of a rotary polygonal mirror in which the rotation of each face defines a portion of a scan length. Furthermore, the pattern that is to be made using the laser beam is defined by means of stored information defining for each point on the panel either that it should be impacted or else that it should not be impacted.

In the light of all the above, it will be understood that however accurately the various components are adjusted initially, it is necessary prior to each use of the machine to verify the real position of the impact of a laser beam relative to the structure of the machine.

For positioning the panel relative to the structure of the machine, it will be understood that this also must be performed with very great accuracy, particularly when the printed circuit panels are designed to form component elements of a multilayer printed circuit. It is recalled that printed circuit panels are usually positioned relative to the structure of the machine by means of circular holes formed at certain locations in the panel that are defined with precision.

OBJECTS AND SUMMARY OF THE INVENTION

An object of the present invention is to provide a device for measuring relative position error between a laser beam and a target which can be constituted, for example, by the structure of an exposure machine or by a printed circuit panel, which device makes it simple to determine error with very great accuracy.

According to the invention, to achieve this object, in a device for measuring relative position error between a laser beam and a target:

said target is provided with a circular orifice occupying a reference position relative to said target; and the device further comprises:

means for focusing the laser beam in the plane of said target; and means for taking an image of said circular hole and of the beam focused in the plane of said target, and means for calculating the components of the segment between said point of impact and the center of said hole.

It will be understood that by means of the invention the error is indeed determined very precisely, in particular because the image-taking means, e.g. a camera, do not need to be positioned with precision since it suffices that they enable an image to be obtained simultaneously of the periphery of the circular hole and of the impact of the laser beam.

Another object of the invention is to provide an application of the above-defined device to making a machine for exposing printed circuit panels in order to position a printed circuit panel relative to the structure of the machine.

In this application said machine further comprises:

means for focusing said laser beam successively on two corresponding points of the structure which ought to be occupied by the centers of the two circular holes;

camera means for taking respective images of the two holes together with the corresponding points of impact of the laser beams;

calculator means responsive to each of said images to calculate the components of the segment joining the center of each circle to the point of impact of the corresponding beam, thereby obtaining two data sets concerning the position error of the panel; and panel-displacement means for displacing said panel relative to the structure, at least in rotation, and control means for controlling the panel-displacement means and the means for focusing the laser beam as a function of the two data sets concerning the position error of the panel.

It will be understood that under such circumstances, the reference is constituted by the point of impact of the laser beam and that the element whose positioning error is to be corrected is the panel together with its two positioning holes.

Another object of the invention is to apply the above-defined detection device to calibrating the laser beam of a machine for exposing printed circuit panels. This application further comprises:

at least one target secured to said structure, said target including at least one circular hole whose center constitutes a reference point of the structure;

means for controlling the beam deflection means on the basis of position information corresponding to the position of the center of said circle;

camera means for taking an image of said circular hole and of the actual point of impact of the laser beam in said hole;

calculator means for calculating the components of the segment joining the center of said hole to the point of impact of the laser beam; and means for transmitting said components to the control means for controlling the beam-deflector means.

It will be understood that under such circumstances, the position reference is constituted by the target provided with the circular hole and the element whose position error is to be determined is the point of impact of the laser beam.

BRIEF DESCRIPTION OF THE DRAWINGS

Other characteristics and advantage of the invention will appear more clearly on reading the following description of various embodiments of the invention given as non-limiting examples. The description refers to the accompanying figures, in which:

FIG. 1A is an elevation view of a device for measuring relative error;

FIG. 1B is a fragmentary plan view of the device for measuring relative error;

FIG. 2 is a simplified view of a machine for exposing printed circuit panels and comprising a device of the invention for positioning a printed circuit panel;

FIG. 3 is a simplified view of a machine for exposing printed circuit panels and fitted with a device for calibrating the laser beam of the machine.

MORE DETAILED DESCRIPTION

Figure 4:
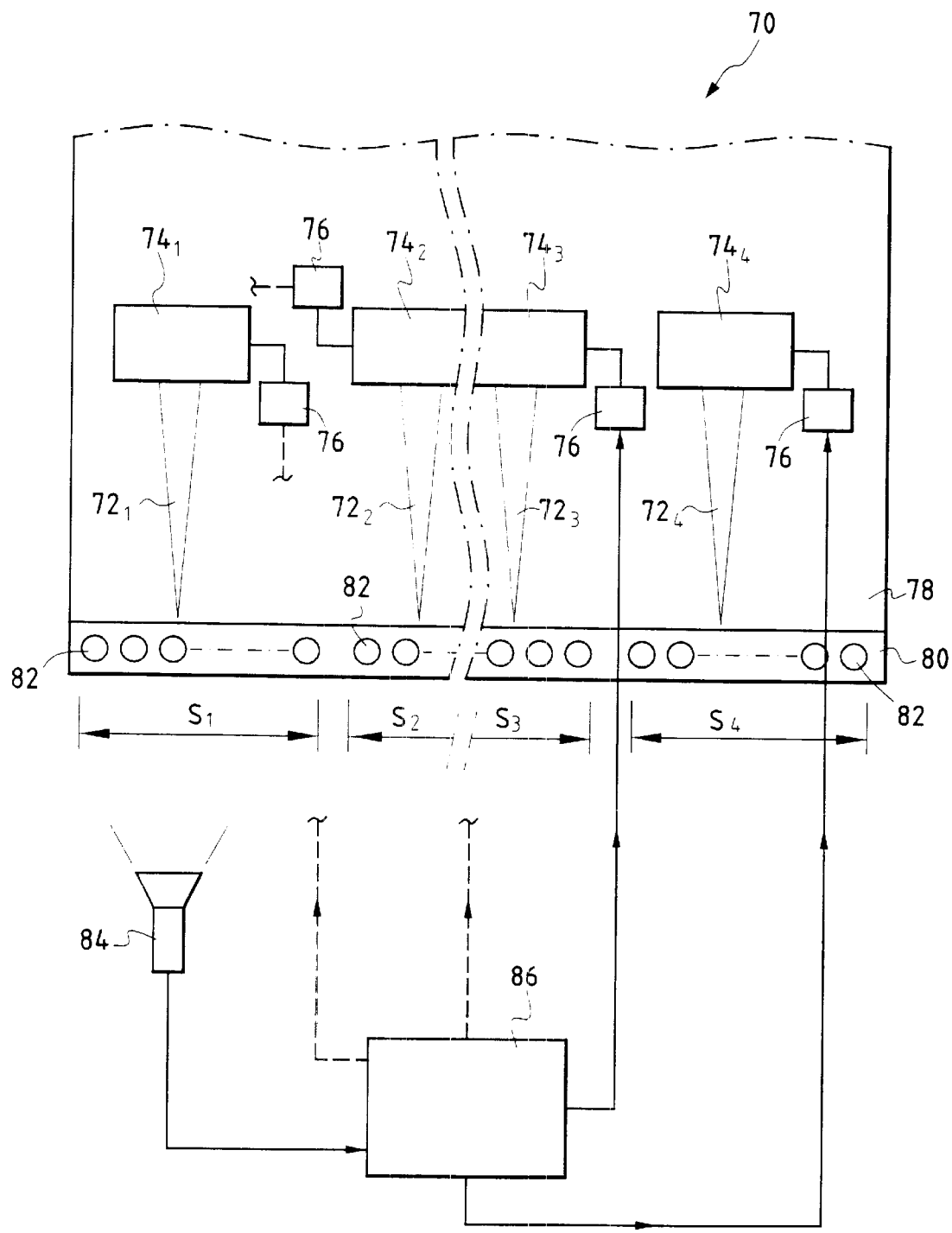
FIG. 4 is a diagrammatic view of a machine having a plurality of laser beams for exposing printed circuit panels.

With reference initially to FIGS. 1A and 1B, there follows a description of the device for detecting and measuring the relative positioning error between a laser beam and a target. In the figures, there can be seen a target 10 and an optical system 12 for emitting a laser beam 14 towards the target 10.

The target 10 is provided with a circular hole 16 of center O, the hole 16 being associated with said target 10 and constituting its position reference. The detection device also has a camera 17 disposed on the other side of the target 10 from the laser beam 14 and capable of taking an image of the periphery of the hole 16 and of the laser beam 14. On the basis of this image, a calculator circuit 18 associated with the camera enables components to be calculated along orthogonal directions X and Y to define the straight line segment joining the center O of the circle to the point of impact A, and thus completely determines the relative position error.

As already described, the device makes it possible to detect and measure two types of absolute position error depending on whether the laser beam constitutes the position reference and the target 10 is movable, or whether the target 10 constitutes the position reference as defined by its circular hole 16, and the laser beam 14 is then possibly suffering from a position error.

Naturally, the camera 17 must be capable of detecting the laser beam. It is possible to use a CCD camera provided with lenses adapted to the wavelengths of the laser beam.

In FIG. 2, there can be seen the use of the device of FIGS. 1A and 1B in calibrating the laser beam relative to the structure of an exposure installation. An optical unit 30 is shown directing a laser beam 32 towards a target 34 secured to the structure 36 of the machine. By way of example, the target 34 is constituted by a strip secured to the structure 36 and made of a material having very great stability, such as Invar. The strip 34 is provided with at least two circular orifices 38 and 40 of accurately defined diameter. The orifices 38 and 40 thus constitute position references for the structure 36. The optical unit 30 is associated with a control assembly 42 for controlling the point of impact of the laser beam.

To calibrate the laser beam, instructions are sent to the optical unit 30 by means of the control circuit 42 to position the laser beam so that it corresponds exactly to the position of the hole 38. Using a camera, an image is taken of the hole 38 and of the beam 32. The circuit 46 associated with the camera 44 calculates the position errors as described above. Because the laser beam is positioned in part in response to instructions stored in its control circuits, the error calculation can be used to correct the instructions that control the positioning of the laser beam.

Since the laser beam is designed to be moved so as to scan over a certain distance relative to the structure, the operation can advantageously be repeated in association with a second reference hole 40 provided in the strip 34 and with the position of the laser beam being controlled with instructions corresponding to the position of said second hole 40. This error determination can be performed with a plurality of holes through the strip 34. These various error measurements at different positions marked by the strip make it possible to calculate an error correction polynomial which can be used to correct the instructions governing the scanning performed by the laser beam in all scanning positions.

With reference to FIG. 3, there follows a description of an application of the relative error detection device to positioning a printed circuit panel 50 in a machine for exposing it by means of the laser beam. In this figure, a machine structure 52 is shown with the panel 50 placed thereon. The panel 50 is provided with two positioning holes 54 and 56. This figure also shows an optical unit 58 which controls the point of impact of a laser beam 60 in response to instructions transmitted by a control circuit 62.

To position the panel 50 relative to the structure 52, the optical unit 58 is controlled so that the beam is focused on a point of the structure which corresponds exactly to the position that ought to be occupied by the center of the positioning hole 54. The camera 63 is used to take an image of the periphery of the hole 54 and of the impact of the laser beam 60, and the coordinates of the error are calculated in the calculator circuit 64. To finalize the operation of positioning the panel, the optical unit 58 is controlled so that a laser beam 60' has a point of impact corresponding exactly to the ideal position of the center of the second positioning hole 56 of printed circuit panel 50. Using a second camera 65, a second image is taken corresponding to the hole 56 and this second position error is applied to the calculator circuit 64. These two position errors make it possible to determine position errors of the panel in two orthogonal directions X and Y and in rotation. The error in rotation can be measured by the angle between the straight line joining the centers of the holes 54 and 56 and the straight line joining the two points of impact of the laser beams. The position error in rotation is transmitted to the control circuit 66 for controlling actuators 68 that enable said error to be corrected. The X and Y position errors are preferably transmitted directly to the control circuits 62 for controlling the optical unit 58.

FIG. 4 shows an exposure machine 70 comprising a plurality of laser beams $72_1$, $72_2$, $72_3$, $72_4$ produced by a corresponding number of optical units $74_1$, $74_2$, $74_3$, $74_4$, each optical unit being controlled by a respective circuit 76. To calibrate the laser beams, the structure 78 of the machine is fitted with an Invar rule 80 having as many series as $S_1$, $S_2$, $S_3$, $S_4$ of calibration holes 82 as there are laser beams to calibrate. The holes in any one series are disposed respectively facing zones $Z_1$, $Z_2$, $Z_3$, and $Z_4$ to be scanned by the laser beam; each series comprises twenty holes, for example.

Using a moving camera 84, images are taken successively of each hole 82 in each series of holes together with images of the laser beams for each series of holes. The calculator circuit 86 then generates a correction polynomial for each laser beam, which polynomial is transmitted to the control circuits 76 of the optical units.

What is claimed is:

1. A device for measuring relative position error between a laser beam and a target; wherein:
    said target is provided with a circular orifice occupying a reference position relative to said target; and
    wherein the device further comprises:
        means for focusing the laser beam in a plane of said target; and
        means for taking an image of said circular hole and of the beam focused in the plane of said target, wherein said means for taking an image is separate from said target, and means for calculating the components of the segment between said point of impact and the center of said hole.

2. The device according to claim 1 wherein the means for taking an image further comprises a camera.

3. A machine for exposing printed circuit panels, the machine comprising:
    a fixed structure suitable for receiving a printed circuit panel, said panel being provided with at least two circular positioning holes; and
    at least one laser associated with optical means for focusing said laser beam on an arbitrary point of the printed circuit;
    wherein said machine further comprises:
        means for focusing said laser beam successively on two corresponding points of the structure which ought to be occupied by the centers of the two circular holes;
        camera means for taking respective images of the two holes together with the corresponding points of impact of the laser beams;
        calculator means responsive to each of said images to calculate the components of the segment joining the center of each circle to the point of impact of the corresponding beam, thereby obtaining two data sets concerning the position error of the panel;
        panel-displacement means for displacing said panel relative to the structure, at least in rotation; and
        control means for controlling the panel-displacement means and the means for focusing the laser beam as a function of the two data sets concerning the position error of the panel.

4. The machine according to claim 3, wherein said calculator means determine the angle between the segments joining the two points of impact of the laser beams and the two centers of the holes, thereby obtaining error information concerning position in rotation of the center of a second hole relative to the center of the first hole, and the components in two orthogonal directions of the structure of the position error of the center of the first hole, and wherein said control means comprise:
    means for controlling the displacement means in rotation as a function of the calculated rotation error; and
    transmission means for transmitting said components to the means for focusing said laser beams.

5. A machine for exposing printed circuit panels comprising:
    a fixed structure for receiving said panel;
    a laser source for producing at least one laser beam
    means for controlling deflection of the laser beam,
    at least one target secured to said structure, said target including at least one circular hole whose center constitutes a reference point of the structure;
    control means for controlling the beam deflection means based on position information corresponding to the position of the center of said circle;
    camera means for taking an image of said circular hole and of the actual point of impact of the laser beam in said hole;
    calculator means for calculating the components of the segment joining the center of said hole to the point of impact of the laser beam; and
    transmission means for transmitting said components to the control means for controlling the beam-deflector means.

6. The machine according to claim 5, wherein:
    said target has a series of circular holes whose centers define a series of position references of the structure;
    said control means include means for controlling the laser beam deflector means successively based on a series of position information data corresponding to the positions of the centers of the series of holes;
    said camera means take a series of successive images of each hole;
    said calculator means determine said components for each image in the series of images and generate a polynomial function for correcting the position of the laser beam based on said series of components as a function of the positions of the centers of the series of holes; and
    said transmission means enable said polynomial correction function to be transmitted to said control means for the deflector means.

7. The machine according to claim 6, wherein said machine comprises:
    means for producing a plurality of laser beams, and
    a plurality of deflector means, each deflector means being associated with a respective laser beam; each deflector means being associated with respective control means so that each laser beam scans a portion of said printed circuit panel;
    wherein said target has a plurality of series of holes, each series of holes corresponding to the portion of the printed circuit scanned by said laser beam; and
    wherein said calculator means determine a polynomial function for correcting position for each series of images associated with a series of holes.

8. A machine for exposing printed circuit panels comprising:
    a fixed structure for receiving said panel;
    a laser source for producing at least one laser beam,
    means for controlling deflection of the laser beam,
    at least one target secured to said structure, said target including a series of circular holes whose centers define a series of position references of the structure;
    control means for controlling deflection of the laser beam successively based on a series of position information data corresponding to the positions of the centers of the series of holes;

camera means for taking a series of successive images of each hole;

calculator means for determining components for each image in the series of images and for generating a polynomial function for correcting a position of the laser beam based on said series of components as a function of the positions of the centers of the series of holes; and transmission means for transmitting said components to the control means for controlling deflection and for enabling said polynomial correction function to be transmitted to said control means for controlling deflection.

9. The machine according to claim 8 further comprising a plurality of deflector means, wherein the laser source is for producing a plurality of laser beams, each deflector means being associated with a respective laser beam and being associated with respective control means so that each laser beam scans a portion of said printed circuit panel, wherein said target has a plurality of series of holes, each series of holes corresponding to the portion of the printed circuit scanned by said laser beam, and wherein said calculator means determines a polynomial function for correcting position for each series of images associated with a series of holes.

* * * * *